United States Patent [19]
Kaplinsky

[11] Patent Number: 5,864,244
[45] Date of Patent: Jan. 26, 1999

[54] TRISTATE BUFFER CIRCUIT WITH TRANSPARENT LATCHING CAPABILITY

[76] Inventor: Cecil H. Kaplinsky, 140 Melville Ave., Palo Alto, Calif. 94301

[21] Appl. No.: 853,690

[22] Filed: May 9, 1997

[51] Int. Cl.$^6$ .............................................. H03K 19/0944
[52] U.S. Cl. .............................. 326/58; 326/57; 326/83; 326/86; 326/27; 327/215; 327/219; 327/333
[58] Field of Search .................................. 326/58, 57, 83, 326/86, 27, 121; 327/215, 219, 333

[56] References Cited

U.S. PATENT DOCUMENTS

| | | | |
|---|---|---|---|
| 5,043,944 | 8/1991 | Nakamura et al. | 365/189.05 |
| 5,311,076 | 5/1994 | Park et al. | 307/443 |
| 5,319,254 | 6/1994 | Goetting | 307/272.2 |
| 5,327,317 | 7/1994 | Lee | 361/88 |
| 5,331,593 | 7/1994 | Merritt et al. | 365/189.11 |
| 5,349,243 | 9/1994 | McClure | 307/272.1 |
| 5,355,029 | 10/1994 | Houghton et al. | 307/443 |
| 5,381,059 | 1/1995 | Douglas | 326/58 |
| 5,396,108 | 3/1995 | McClure | 327/108 |
| 5,548,229 | 8/1996 | Segawa et al. | 326/57 |

*Primary Examiner*—Michael J. Tokar
*Assistant Examiner*—Qui Van Duong
*Attorney, Agent, or Firm*—Thomas Schneck; Mark Protsik

[57] ABSTRACT

A first output buffer circuit with independent transparent latch and tristate output capabilities includes input translators that directly drive a pair of main pull-up and pull-down output transistors. The input translators are tristatable in response to latch control signals and latching elements on side branches of the signal paths leading from the translator outputs to the output transistor gates hold the last voltage value on those signal paths at the time the translators are disabled. The main current paths through the output transistors include isolation transistors in series with the output transistors and responsive to feedback control from the buffer output. These feedback paths include logic gates responsive to output enable control signals that can shut off isolation transistors and hence put the buffer output in a high impedance state. Since neither the latch or output enable control, nor the latch elements themselves, are signal delaying components in the main signal path from the buffer input to the buffer output, throughput speed is not adversely affected.

9 Claims, 2 Drawing Sheets

TRISTATE BUFFER CIRCUIT WITH TRANSPARENT LATCHING CAPABILITY

TECHNICAL FIELD

The present invention relates to buffer circuits for interfacing digital signals between different circuit elements, for example between on-chip elements of an integrated circuit and printed circuit board traces leading to other integrated circuit chips. The invention also relates to latching circuits and combinations of buffers with latches. The present invention particularly relates to tristate buffers, i.e. buffer circuits with a third high impedance state in addition to the high and low voltage level logic states, and to latches which can be selectively made transparent to signals, if desired.

BACKGROUND ART

U.S. Pat. Nos. 5,349,243 to Houghton et al. and 5,381,059 to Douglas disclose output buffers that include tristate predriver circuitry controlling the buffers' output transistors. In U.S. Pat. No. 5,311,076, Park et al. disclose a tristate data output buffer having a preset circuit, responsive to an output enable signal, for setting the buffer's output node to an intermediate voltage level in advance of a data output operation, thereby minimizing the required voltage swing at the output during a transition and thus reducing the current impulses that cause noise. None of these output buffers have any latching capability.

In conventional buffer circuits, it is very difficult to provide both transparent latching and a tristate output in the same circuit, with independent operation, while maintaining high speed. In tristate buffers, in addition to logic HIGH and LOW output voltage levels, a third high impedance state can be asserted, if desired. Such buffers generally employ logic gates in the signal path leading to the main output driver transistors, and responsive to an output enable control signal, to shut off both output transistors whenever the high impedance state is required. A transparent latch element transmits its input to its output whenever a latch enable control signal is asserted, thereby allowing the output value to change whenever the input changes, but when the control signal goes low, the latch element then stores and outputs the value that the input last had when the control signal changed, ignoring any subsequent changes at the latch's input until the control signal is reasserted. Such a latch element could be implemented, for example, by a pair of cross-coupled inverters with a pass gate provided on the latch's input side. Buffer circuits that include latches typically locate one or more of a latch's components directly in the buffer's signal path. Logic gates or latch components in the signal path tend to slow signal propagation to the buffer's output, even when the buffer is not tristated or latched. In order to maintain high speed operation, prior devices are generally either tristate output buffers with no latching capability at all, as in the aforementioned patents, or are limited to providing latching operation only when the output is tristated, i.e. in a high impedance state.

Thus, in U.S. Pat. No. 5,327,317, Lee discloses a buffer circuit serving as a data line driver for a memory. The circuit includes a helper flip-flop section connected to I/O lines from the memory array. The I/O lines are allowed to develop a differential potential prior to clocking the flip-flop with a strobing enable signal. While enabled, the flip-flop uses positive feedback to pull the true and complement output signals towards opposite supply potentials, thus amplifying the differential input signal received from the I/O lines. The large differential output potential provided by the flip-flop drives the input of a buffer section of the circuit. The buffer, in turn, drives complementary data lines. The output of the flip-flop also drives a data latch to hold the data between read operations. The latch is strobed by the same enable signal that controls the flip-flop and buffer sections, so that the latch is set or reset when one of the data lines driven by the buffer transitions low.

In U.S. Pat. Nos. 5,349,243 and 5,396,108, McClure discloses latch-controlled output drivers that include latch circuits connected to the gates of the drivers' pull-up and pull-down output transistors. In the '108 patent, the output can be tristated by disabling the pass gate inputs to the latches and by activating an enable/disable control circuit that turns both output transistors off. A third latch continues to receive input signals so that at the end of a tristate disable period, the pair of latches controlling the output transistors can be restored to the last valid input state. The latches cannot be made transparent independent of the tristate output driver stage.

An object of the present invention is to provide a high speed buffer circuit with independent tristate and transparent latch capabilities.

DISCLOSURE OF THE INVENTION

The object is met with a buffer circuit that includes a pair of tristate input translators connected to the buffer's input and enabled by a latch control signal. The input translators directly drive a corresponding pair of main pull-up and pull-down output transistors. Latch elements, which are located on side branches of the pair of signal paths leading from the input translators to the main output transistors, maintain these signal paths' voltage value whenever the input translators are disabled by the latch control signal. Otherwise, the latch elements are transparent to the buffer circuit. In series with the respective pull-up and pull-down current paths through the main output transistors are a pair of isolation transistors that are responsive to feedback control from the buffer output. The feedback paths controlling these isolation transistors include logic gates receiving an output enable signal as well as the output voltage level. The output can thus be tristated by shutting off both isolation transistors with a change in the output enable control signal. The transparent latch elements operate independently of the tristate output control. Moreover, since neither the latch elements nor the tristate control locate any components in the direct signal path from the outputs of the pair of input translators to the gates of the pair of main output transistors, the throughput speed of a transitioning signal is not adversely affected.

An added advantage of the isolation transistors present in the main pull-up and pull-down current paths between the voltage supply lines and the buffer's output is that these isolation transistors can be used to ensure that both current paths are not simultaneously partially or fully conductive, thereby preventing the two current paths from fighting each other in producing a transition at the buffer's output, and also avoiding large current dissipation between the two voltage supply lines through these main current paths. Moreover, the isolation transistors allow the main pull-up current path to be isolated from the output once the output voltage has risen above the lower limit of the predefined logic HIGH level, and likewise allow the main pull-down current path to be isolated from the output once the output voltage has fallen below the upper limit of the predefined logic LOW level. The transition can then be completed and the output maintained by a set of smaller sustaining transistors in parallel with the main output transistors. The smaller current paths through the sustaining transistors shows the completion of the transition after high speed is no longer required, preventing overshoot or undershoot of the output's target voltage level and preventing voltage drop or ground bounce of the voltage supply lines. The sustaining transistors may be responsive to the output from one or both input translators, and can be tristated by the output enable control signal.

In preferred embodiments of the present invention, the input translators have input transition voltage levels that are selected to speed recognition of the beginning of a transition of the input signal received by the buffer's input. In yet another embodiment, the input translators can be made smaller and still effectively drive the turn on and turn off of the main output transistors, if the main pull-up and pull-down current paths are split between primary and secondary current paths, where the supplemental pull-up and pull-down output transistors in the secondary current paths are slightly delayed in their response to the outputs of the input translators relative to the main output transistors in the primary current paths. The delayed response can be provided by driving the supplemental transistors via the side branch latch elements and logic gates receiving the same feedback signals as the isolation transistors.

BEST MODE OF CARRYING OUT THE INVENTION

Figure 1:
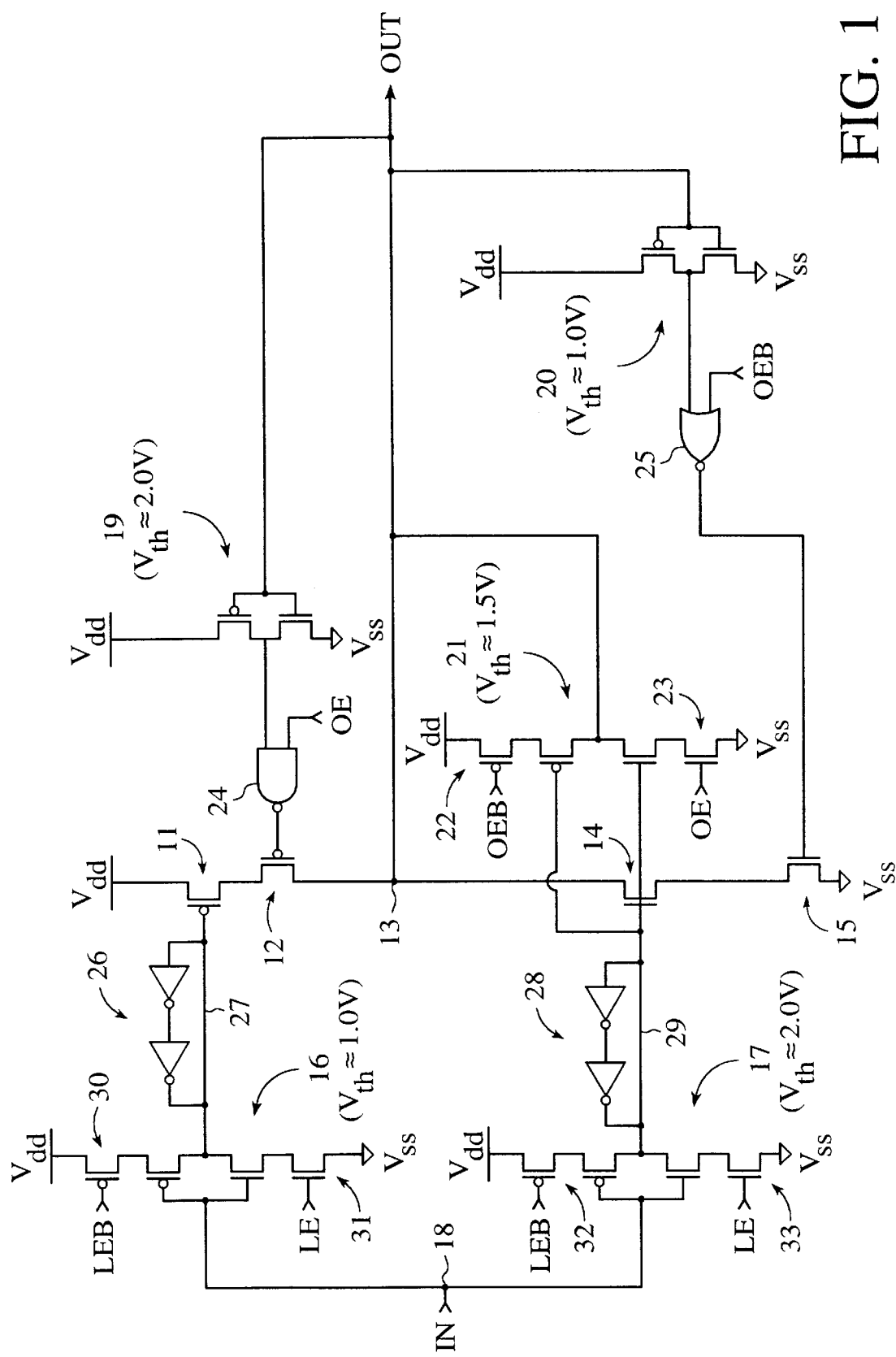
FIG. 1 is a schematic plan circuit diagram of a first embodiment of a buffer circuit according to the present invention.

With reference to FIG. 1, a tristate output buffer circuit with transparent latch capabilities in accord with the present invention is shown. The circuit includes first and second p-channel transistors 11 and 12 connected in series in a main pull-up current path between a first voltage supply line $V_{DD}$ (typically 5 V) and an output node or line 13 leading to the output OUT of the buffer circuit. The circuit further includes first and second n-channel transistors 14 and 15 connected in series in a main pull-down current path between the output node 13 and a second voltage supply line $V_{SS}$ (typically 0V, i.e., ground). A pair of tristate input translators 16 and 17 with inputs that are connected to an input node or line 18 which receives an input IN to the buffer circuit, when enabled by latch control signals LE and LEB, directly drives the gates of output transistors 11 and 14, respectively, i.e. one transistor in each of the main current paths for the output node or line 13. The other two transistors 12 and 15 in those main current paths form isolation transistors that are responsive to control signals that are derived by feedback circuit elements 19, 24, 20 and 25 in feedback paths from the output line 13. A set of sustaining transistors 21 forming a tristate inverter responsive to one of the input translators 17 provides secondary current paths between the voltage supply lines $V_{DD}$ and $V_{SS}$ and the output node or line 13. Both the feedback circuit elements 24 and 25 controlling the isolation transistors 12 and 15 and the tristate inverter formed by the set of sustaining transistors 21 are responsive to output enable signals OE and OEB. In particular, the logic gates 24 and 25 receive the respective enable signals OE and OEB at one of their respective inputs. Likewise, there are a pair of transistors 22 and 23, in series with the set of sustaining transistors 21, which receive the output enable signals OEB and OE at their respective transistor gates. Returning now to the direct signal paths 27 and 29 between the respective outputs of the tristate input translators 16 and 17 and the respective gates of main output transistors 11 and 14, latch elements 26 and 28 consisting of pairs of small inverters are located on side branches of the signal paths 27 and 29. These latch elements maintain the last voltage level that are present on the signal paths 27 and 29 at the time when the input translators 16 and 17 are disabled (via latch control signals LE and LEB) until the input translators 16 and 17 are re-enabled (again by signals LE and LEB), but are otherwise transparent when the translators 16 and 17 are active. Transistors 30–33 in the current paths between the voltage supply lines $V_{DD}$ and $V_{SS}$ and the signal paths 27 and 29 receive the latch control signals LE and LEB at their gates.

The latching capability of the buffer circuit of FIG. 1 is provided by the tristate input translators 16 and 17 with their latch control signal responsive transistors 30–33 and by the latch elements 26 and 28 on side branches of the signal paths 27 and 29 leading to the output transistors 11 and 14 (and also to the set of sustaining transistors 21). When the latch control signal LE connected to the n-channel transistors 31 and 33 of the translators 16 and 17 is high, and the complementary latch control signal LEB connected to the p-channel transistors 30 and 32 of the translators 16 and 17 is low, the input translators 16 and 17 are enabled and active. Then an input signal IN presented via node 18 to the inputs of translators 16 and 17 is inverted by the translators and the inverted signal is applied on translator output signal paths 27 and 29 to the gates of output transistors 11 and 14 (and also to the set of sustaining transistors 21). A low input signal IN is thus translated into high drive signals on signal paths 27 and 29, so that main pull-down transistor 14 is conductive ('on') and main pull-up transistor 11 is off. If the isolating transistor 15 is also on, then the main pull-down current path through transistors 14 and 15 will allow the low voltage supply line $V_{SS}$ to sink current from the output node or line 13, pulling down the output voltage OUT. Likewise, a high input signal IN is translated into low drive signals on paths 27 and 29, such that main pull-up transistor 11 is on and main pull-down transistor 14 is off. Assuming the isolation transistor 12 in the pull-up current path is also on, the high voltage supply line $V_{DD}$ will source current through transistors 11 and 12 to the output node 13, pulling up the output OUT.

However, when latch control signal LE is low and the complementary latch control signal LEB is high, the input translators 16 and 17 are cut off from the voltage supply lines $V_{DD}$ and $V_{SS}$ and are nonresponsive to input signals IN. Then the last drive voltage asserted on signal paths 27 and 29 are stored or held by the dual-inverter latch elements 26 and 28 connected to the signal paths 27 and 29 on side branches thereof. These latch elements 26 and 28 maintain the last received translator outputs so that the on-off status of main output transistors 11 and 14 remain unchanged. When latch control signals LE and LEB again reverse states to reactivate the input translators 16 and 17, changes at input IN are again recognized. Latch elements 26 and 28 are not intended to drive the output transistors 11 and 14 to change their on-off state, but merely to maintain voltage on signal paths 27 and 29 and the existing on-off state of transistors 11 and 14 in accord with the last received transition of the outputs of translators 16 and 17. Thus latch elements 26 and 28 can have inverters that are relatively small, leaving the driving of output transistors 11 and 14 to the larger input translators 16 and 17. The latch elements 26 and 28 on side branches of signal paths 27 and 29 are effectively transparent whenever the input translators 16 and 17 are enabled.

The input translators 16 and 17 should have transistor sizes that will obtain a desired speed of turn on (or off) of the large output transistors 11 and 14. The output of the first input translator 16 drives the main p-channel pull-up transistor 11, and the output of the second input translator 17 drives the main n-channel pull-down transistor 14 (as well as the set of sustaining transistors 21). For a fast buffer, it is desirable that the turn on time of the large output transistors 11 and 14 should not be too slow, so that fairly strong input translators 16 and 17 are required to avoid a sluggish response. However, a more significant consideration is avoid inductance-caused voltage droop or ground bounce of the power supply lines $V_{DD}$ and $V_{SS}$ that can occur if the output transistors 11 and 14 turn on too rapidly. Therefore, the input translators are preferably sized to provide outputs on paths 27 and 29 having relatively slow ramp rates (about 2.25 V/ns) that are at most two times faster than that of the input signal IN (typically, 3V in about 2.5 ns). The slower ramp rate of the signals driving the output transistors 11 and 14 assure that these transistors will turn on slow enough to avoid the voltage droop or ground bounce problem without being so slow as to significantly affect the speed of the buffer. The slower ramp rate is compensated by the direct driving of the output transistors 11 and 14 by the input translators 16 and 17, respectively, without any intervening NAND or NOR logic gates in the signal paths 27 and 29 that would otherwise reduce throughput time of a signal transition due to propagation delays through such gates.

In a preferred embodiment, the input translators 16 and 17 have switching or transition points that are selected to speed recognition of the beginning of a signal transition on the input IN. This early transition recognition further speeds the buffer's signal throughput. In particular, the first input translator 16 has a transition point $V_{th}$ that is less than the 1.5V nominal transition voltage of the overall buffer circuit. Preferably, this reduced transition point $V_{th}$ for the translator 16 driving the main pull-up output transistor 11 is at or just above the 0.8V to 1.0V upper end of the voltage range that defines logic LOW signals, e.g., a 1.0V transition point. Likewise, the second input translator 17 which drives the main pull-down output transistor 14 has a transition point $V_{th}$ that is greater than the 1.5V nominal transition voltage of the overall buffer circuit. Preferably, this increased transition point $V_{th}$ is at or just below the 2.0V to 2.2V lower end of the voltage range that defines logic HIGH signals, e.g. a 2.0V transition point. In this way, low-to-high transitions of the input IN are recognized by the first input translator 16 before it reaches 1.5V so that pull-up by the output transistor 11 can begin sooner. High-to-low transitions of the input IN are recognized by the second input translator 17 before it has fallen to 1.5V so that pull-down by the output transistor 14 can begin sooner. Conflict between the output transistors 11 and 14 are avoided by the isolation transistors 12 and 15, as discussed below. Despite the general tendency of translators with early transition detection to be more vulnerable to input noise spikes, the slow ramp rate of the input translators 16 and 17, discussed above, allows these translators to reject such noise. Spikes of less than 1 ns duration and less than 1.8V peaks do not cause the output transistors 11 and 14 to turn on sufficiently to pull the output line 13 through the buffer's transition point, so output noise is not generated as a result of such spikes.

Transistor sizes for the input translators 16 and 17 are selected to give them the desired transition voltages of about 1.0V and 2.0V, respectively. Actual channel dimensions will depend upon the technology being used. However, in general, it is the ratios in channel widths between the p-channel and n-channel transistors of the input translators 16 and 17 that are of primary importance in establishing their transition voltages, rather than the channel widths themselves. The dimensions are a matter of routine design for a given transistor technology.

Turning now to the independent tristate output capability provided by the isolation transistors 12 and 15 and by the feedback elements 19, 24, 20 and 25, the buffer circuit in FIG. 1 includes a pair of feedback paths from the output line 13 to the isolation transistors 12 and 15. Each feedback path includes an inverter 19 and 20, respectively, responsive to the voltage level on the output line 13 and further includes a logic gate 24 and 25, respectively, responsive to an output enable signal OE or OEB to provide the tristate output control. The first feedback inverter 19 controls shut off of the first isolation transistor 12 in the main pull-up current path. This inverter 19 has a transition or switching point at or near the 2.0V to 2.2V lower end of the predefined logic voltage range, e.g. about 2.0V. The inverter 19 is followed by a NAND gate 24 having one input connected to the output of inverter 19 and a second input receiving an output enable control signal OE. The output of NAND gate 24 is connected to the gate of isolation transistor 12. The second feedback inverter 20 controls shut off of the second isolation transistor 15 i the main pull-down current path. This inverter 20 has a transition point at or near the 0.8V to 1.0V upper end of the predefined logic LOW voltage range, e.g. about 1.0V. The inverter 20 is followed by a NOR gate 25 having one input connected to the output of inverter 20 and a second input receiving an output enable control signal OEB. The output of NOR gate 25 is connected to the gate of isolation transistor 15.

The circuit is a tristate buffer whose output OUT is placed in a high impedance state whenever the complementary output enable control signals OE and OEB are respectively low and high. This causes the outputs of the NAND and NOR gates 24 and 25 to be respectively high and low, thereby shutting off both isolation transistors 12 and 15 in the main pull-up and pull-down current paths, so as to isolate the output node 13 from the power supply lines $V_{DD}$ and $V_{SS}$. Further, another set of isolation transistors 22 and 23 in series with the set of sustaining transistors 21 are directly controlled by the output enable control signals OE and OEB, respectively. When OE and OEB are respectively low and high, both of these transistors 22 and 23 shut off, isolating the output line 13 from the voltage supply lines through the sustaining current paths through transistors 21–23.

When the output enable control signals OE and OEB are respectively high and low, the buffer circuit is responsive to the input IN, producing a corresponding high or low output OUT. The sustaining transistors 21 are connected through active transistors 21 and 22 to their voltage supply lines $V_{DD}$ and $V_{SS}$, while the NAND and NOR logic gates 24 and 25 act simply as a second set of inverters following feedback inverters 19 and 20. Accordingly, during a low-to-high transition on the output line 13, the pull-up isolation transistor 12 shuts off once the output OUT exceeds about 2.0V (the transition voltage of inverter 19). Likewise, during a high-to-low transition on the output line 13, the pull-down isolation transistor 15 shuts off once the output has fallen below about 1.0V (the transition voltage of inverter 20). This forces the remainder of the transition of the output voltage to be completed by the smaller sustaining transistors 21, thereby slowing the ramp rate after a rapid ramp rate provided by the main output transistors 11 and 14 is no longer needed, and thereby avoiding overshoot of the target voltage level (usually the supply voltage $V_{DD}$ or $V_{SS}$).

Thus, the buffer can be seen as including two pull-up current paths and two pull-down current paths, namely the main current paths through the output transistors and isolation transistors 11, 12, 14 and 15 and the secondary sustaining current paths through the set of sustaining transistors 21 and their isolating transistors 22 and 23. The main current paths have much larger current sourcing or sinking capacity for the output line 13 than the secondary sustaining current paths through transistors 21–23, because the main output transistors and their isolation transistors 11, 12, 14 and 15 have greater channel width or size and thus larger saturation currents. The main transistors 11 and 14 should have about the same size as their respective isolation transistors 12 and 15, since the current through these transistors is that of the smaller device. The main current paths serve to pull the output node or line 13 up or down as the case may be, dependent upon the buffer's input signal transition communicated through the inverting input translators 16 and 17 to the main output transistors 11 and 14, at a relatively rapid ramp rate until the output has risen above the defined logic HIGH voltage boundary at or near 2.0V or until the output has fallen below the defined logic LOW voltage boundary at or near about 1.0V. Then the isolating transistor 12 or 15 in that main pull-up or pull-down current path shuts off. the set of smaller sustaining transistors 21 then complete the transition through one of the secondary current paths at a slower rate. This slower rate has the benefit of preventing inductance-caused overshoot of the target high or low voltage level (normally $V_{DD}$ or $V_{SS}$).

The shut off of the isolating transistors 12 and 15 in response to the feedback from the output line 13 has the additional benefit of preventing both main pull-up and pull-down current paths from being conductive or partially conductive at the same time during a transition. This not only prevents excessive power dissipation via current leakage through the main current paths between the two power supply lines $V_{DD}$ and $V_{SS}$, but also prevents the two main current paths from fighting one another and thereby unnecessarily slowing the output transition. This effect of the isolation transistors 12 and 15 is due in part to the fact that the voltage level on the output line 13 to which the transistors 12 and 15 are responsive lags transitions on the buffer's input and signal paths 27 and 29 that drive the output transistors 11 and 14 (as well as sustaining transistors 21). In addition, the several layers of logic provided by elements 19, 20, 24 and 25 further delays the response of the isolation transistors 12 and 15 relative to the main output transistors 11 and 14. Thus, at the beginning of a low-to-high transition, input IN and output OUT are both low (<1 V), transistor 11 is off, transistor 12 is on, so that the main pull-up current path is off, i.e. nonconductive, transistor 14 is on, transistor 15 is off, so that the main pull-down current path is also off, and the p-channel pull-up and n-channel pull-down sustaining transistors 21 are respectively off and on, so that the output line 13 is sustained low. When the input rises above 1V, the output is still below 1V, so that transistor 11 turns on, turning on the main pull-up current path, but since the transistor 15 remains off, the main pull-down path stays off despite the fact that transistor 14 is still on. When the input reaches 2V, the output is now between 1V and 2V, such that transistor 14 turns off, while transistor 15 turns on. Thus, the main pull-down path effectively remains off. Moreover, the sustaining transistors 21 reverse their state and are now supporting the main pull-up operation. When the output reaches 2V, the transistor 12 turns off, shutting off the main pull-up path, but the sustaining transistors 21 continue to pull the output up to its target voltage at a slower rate. Likewise, at the beginning of a high-to-low transition, both input IN and output OUT are high (>2 V), transistor 11 is on, transistor 12 is off, transistor 14 is off and transistor 15 is on, so that both main current paths are off, while the p-channel pull-up and n-channel pull-down sustaining transistors 21 are respectively on and off, so that the output line 13 remains high. When the input falls below 2V, the output is still above 2V, so that transistor 14 turns on, turning on the main pull-down current path, but since the transistor 12 remains off, the main pull-up path stays off despite the fact that transistor 11 is still on. When the input falls below 1V, the output is between 1V and 2V, such that transistor 11 turns off, while transistor 12 turns on. Thus, the main pull-up path effectively remains off. Moreover, the sustaining transistors 21 reverse their state and are now supporting the main pull-down operation. When the output falls below 1V, the transistor 15 turns off, shutting off the main pull-down path, but the sustaining transistors 21 continue to pull the output down to its target voltage at a slower rate. Since both main current paths are not simultaneously on, power dissipation and pull-up/pull-down conflicts are avoided. The current leakage that may occur through the much smaller sustaining transistors 21 is not significant. The buffer of the present invention typically has an input-to-output transition time of about 1.5 ns, which is about 30% faster than prior devices.

As an alternative, the sustaining transistor 21 in charge of completing and maintaining pull-up of the output line 13, as well as its isolation transistor 22, should be replaced with n-channel transistors is rail-to-rail transitions all the way up to $V_{DD}$=5 V is desired, so as to minimize power dissipation. If the output OUT is to be pulled up only to TTL levels of approximately 3.4–3.8 V, then they can be p-channel devices, as shown.

Figure 2:
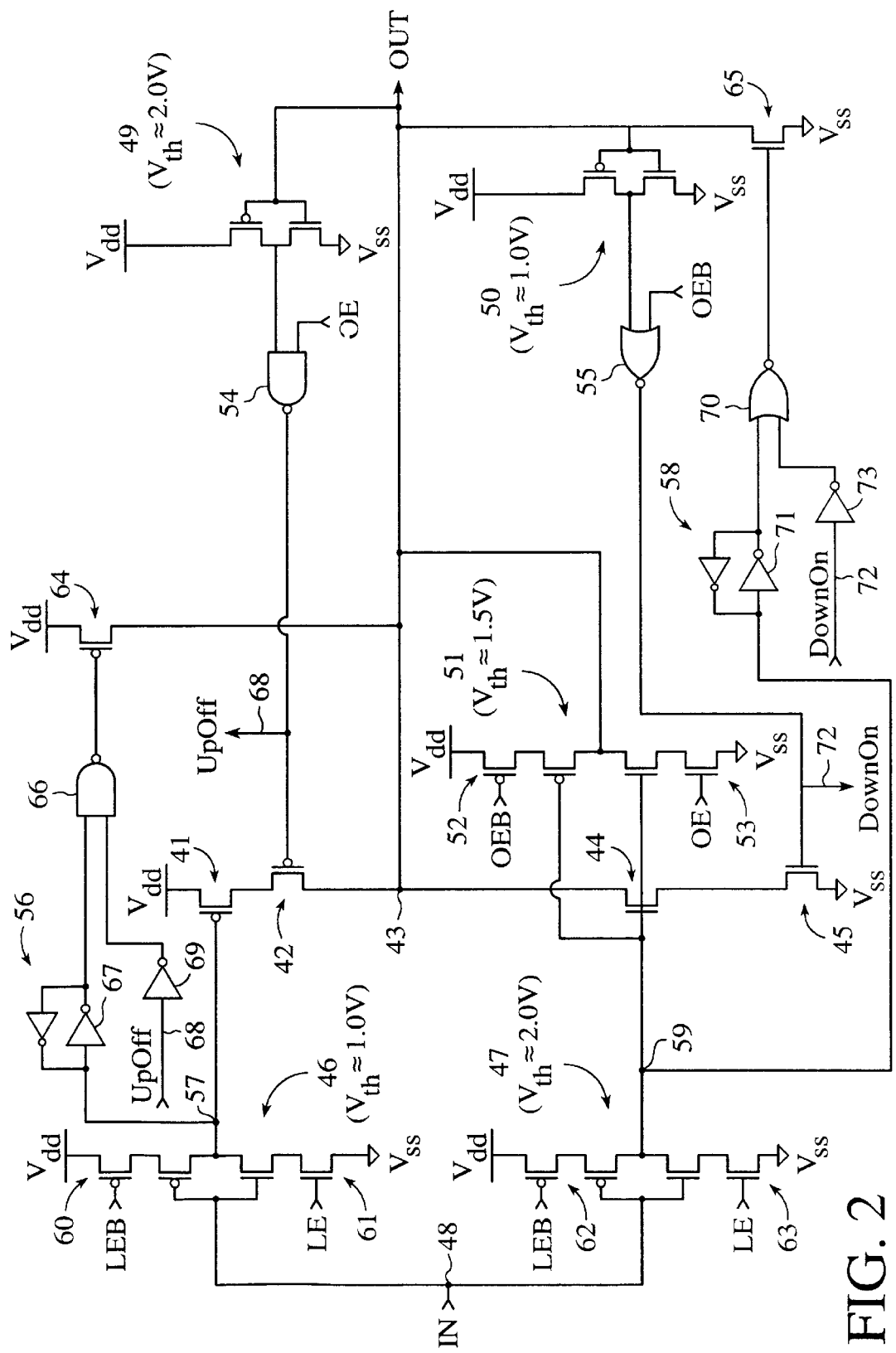
FIG. 2 is a schematic plan circuit diagram of a second embodiment of a buffer circuit according to the present invention, in which the main pull-up and pull-down current paths for the buffer output has been split into primary and secondary paths.

With reference to FIG. 2, another preferred embodiment of the invention splits the main current paths into two, with one having a delayed response relative to the other, so that smaller input translators can be used. However, most of the circuit elements are the same as in the embodiment of FIG. 1. In particular, the input node 48 receiving a buffer input IN connects to the inputs of input translators 46 and 47. These input translators are tristate inverting translators that are responsive to latch control signals LE and LEB through transistors 60–63. The outputs of translators 46 and 47 directly drive one set of main output transistors 41 and 44, and one or both of the translators (e.g., 47) operates the set of smaller sustaining transistors 51. There are also isolation transistors 42 and 45, in series with the output transistors 41 and 44, which are responsive to control signals derived from feedback from the buffer's output line 43 by means of feedback inverters 49 and 50 and logic gates 54 and 55. The NAND and NOR logic gates 54 and 55 are also responsive to output enable control signals OE and OEB so that the buffer can have a tristate output. Transistors 52 and 53, also responsive to the output enable signals OE and OEB tristate the sustaining transistors 51. The input translators 46 and 47 and the feedback inverters 49 and 50 may have the same switching or transition points $V_{th}$ as the corresponding circuit elements 16, 17, 19 and 20 in FIG. 1.

The buffer circuit in FIG. 2 further includes another set of main pull-up and pull-down output transistors 64 and 65 in parallel with the first set 41 and 44. Thus, the main pull-up current path is now divided between a first path through transistors 41 and 42 and a second path through transistor 64. Likewise, the main pull-down current path is also now divided between a first path through transistors 44 and 45 and a second path through transistor 65. The combined strength or current carrying capacity of the divided paths should approximately match that of the corresponding single paths through transistors 11 and 12 or 14 and 15 in FIG. 1. The first, or primary group of transistors 41, 42, 44 and 45 are now somewhat smaller (that is, have smaller saturation currents), but otherwise operate in the same way as transistors 11, 12, 14 and 15 in FIG. 1.

The newly added second group of transistors 64 and 65 for the second current paths have a slightly delayed response relative to transistors 41 and 44. In particular, the input translators 46 and 47 drive the transistors 41 and 44 directly along signal paths 57 and 59, but drive the transistors 64 and 65 along side branch paths through latch elements 56 and 58 and logic gates 66 and 70. Latch elements 56 and 58 serve as latches, as in FIG. 1, to hold the voltage level last output on signal paths 57 and 59 from the input translator 46 and 47 when those translators are disabled by latch control signals LE and LEB (low and high, respectively), and also double as delay elements by means of inverters 67 and 71 for the transistors 64 and 65. The NAND and NOR logic gates 66 and 70 provide further signal propagation delay to the signals driving transistors 64 and 65, and also provide tristate operation for these transistors 64 and 65. In particular, the outputs from NAND and NOR gates 54 and 55 that drive the isolation transistors 42 and 45 in the first current paths also provide their control signals UPOFF and DOWNON, respectively, along side branches 68 and 72 of the feedback paths through inverters 69 and 73 to the NAND and NOR gates 66 and 70. Thus, second output transistors 64 and 65 shut off whenever OE and OEB applied to logic gates 54 and 55 are respectively low and high, and also shut off with the respective isolation transistors 42 and 45 whenever the output voltage has risen above 2.0V or fallen below 1.0V, respectively. Because the propagation delay in the branch paths leading from the translator outputs 57 and 59 to the transistors 64 and 65 cause those transistors to turn on later in time than primary transistors 41 and 44, the pull-up or pull-down transition of the output node or ground bounce of the respective power supply lines $V_{DD}$ and $V_{SS}$. Moreover, the input translators 46 and 47 can be smaller and have a faster output ramp rate than translators 16 and 17 of FIG. 1 since they can separately turn on two separate output transistors 41 and 64 or 44 and 65 with slightly delayed turn on times.

The buffer circuits of the present invention provide both transparent latching via tristatable input translators responsive to latch control signals LE and LEB and latching elements on side branches of the translator output signal paths, and a tristatable output via isolation transistors in the main pull-up and pull-down current paths that can be shut off in response to output enable control signals OE and OEB, as well as output feedback levels. The two capabilities are completely independent of each other and do not require logic gates or other signal propagation delaying elements in the main signal paths leading from the buffer input to the buffer output. Thus, high speed can be maintained.

I claim:

1. A tristate buffer circuit with independent transparent latching capability, comprising:

an input terminal of the buffer circuit for receiving an input signal, first and second input translators with respective inputs thereof both connected to said input terminal of the buffer circuit and with respective outputs thereof connected to corresponding first and second signal paths, first and second latch elements located on respective side branches of said first and second signal paths, said first and second input translators being enablable and disablable in response to a latch control signal received by said first and second input translators at respective control inputs thereof, wherein said input translators drive said signal paths in response to the input signal received thereby whenever said latch control signal is in a first state, said latch elements being effectively transparent to said signal paths, and wherein whenever said latch control signal is in a second state, the input translators are disabled and said latch elements maintain the voltage level of said signal paths last output from said input translators, first and second output transistors with gates connected to said signal paths so as to be directly drivable by said input translators, said output transistors located in respective pull-up and pull-down current paths between respective first and second voltage supply lines and an output of the buffer circuit, first and second isolation transistors located in said respective pull-up and pull-down current paths in series with said output transistors, said isolation transistors having gates connected to receive control signals, first and second feedback circuit means connected between said output of the buffer circuit and said gates of said first and second isolation transistors, said feedback circuit means responsive to a voltage level on said output of the buffer circuit and to an output enable control signal to derive said control signals for said isolation transistors, said isolation transistors shutting off both said pull-up and pull-down current paths whenever said output enable control signal is in a first state, and tristate output level sustaining means responsive to an output from one of said input translators and to said output enable control signal for maintaining an output level established by said output transistors whenever said output enable control signal is in a second state.

2. The circuit of claim 1 wherein said first input translator has a transition point which is less than a nominal transition point for the buffer circuit, and said second input translator has a transition point which is greater than said nominal transition point.

3. The circuit of claim 1 wherein such latch element comprises a pair of inverters connected such that the output of each is connected to the input of the other, the input of one inverter being connected to said side branch.

4. The circuit of claim 1 wherein each feedback circuit means comprises a feedback inverter with an input connected to the output of the buffer circuit and with an output connected to one input of a logic gate, a second input of the logic gate connected to receive said output enable control signal, an output of said logic gate connected to the gate of one of said isolation transistors.

5. The circuit of claim 4 wherein said feedback inverter of said first feedback circuit means for said first isolation transistor has a transition point near a predefined lower voltage range boundary for a logic HIGH signal, and wherein said feedback inverter of said second feedback circuit means for said second isolation transistor has a transition point near a predefined upper voltage range boundary for a logic LOW signal.

6. The circuit of claim 1 wherein said tristate output level sustaining means comprises a pair of pull-up transistors and a pair of pull-down transistors connected in series between said first and second voltage supply lines, one pull-up transistor and one pull-down transistor being connected to receive said output enable control signal and a complementary output enable control signal, respectively, and the other pull-up transistor and other pull-down transistor connected in common to said output of one of said input translators, a node between said pair of pull-up transistors and said pair of pull-down transistors connected to said output of the buffer circuit.

7. The circuit of claim 1 further comprising third and fourth output transistors located in second pull-up and pull-down current paths between said respective first and second voltage supply lines and said output of the buffer circuit in parallel with said first and second output transistors, said third and fourth output transistors connected to said outputs of said respective first and second input translators via said side branches through said latch elements, said side branches also having signal propagation delay means therein for delaying turn-on of said third and fourth output transistors relative to turn-on of said corresponding first and second output transistors.

8. The circuit of claim 7 wherein said side branches further have logic means responsive to said output enable control signal for shutting off said third and fourth transistors whenever said output enable control signal is in said first state.

9. A buffer circuit comprising:

a first output transistor and a first isolation transistor connected in series between a first voltage supply line and an output node of the buffer circuit, a first input translator with an input connected to a buffer input and with an output directly driving said first output transistor along a first signal path, said first input translator being enablable and disablable in response to at least one latch control signal, a first latch element located on a side branch of said first signal path for holding the last voltage level on said first signal path at a time when said first input translator is disabled until said first input transistor is re-enabled, a first feedback circuit between said output node of the buffer circuit and said first isolation transistor for deriving a control signal for said first isolation transistor in response to a voltage level at said output node and further in response to an output enable control signal, said first isolation transistor being shut off whenever said output enable control signal has a first state, a second output transistor and a second isolation transistor connected in series between said output node of the buffer circuit and a second voltage supply line, a second input translator with an input connected to said buffer input and with an output directly driving said second output transistor along a second signal path, said second input translator being enablable and disablable in response to at least one said latch control signal, a second latch element located on a side branch of said second signal path for holding the last voltage level on said second signal path at a time when said second input translator is disabled until said second input translator is re-enabled, a second feedback circuit between said output node of the buffer circuit and said second isolation transistor for deriving a control signal for said second isolation transistor in response to said voltage level at said output node and further in response to an output enable control signal, said second isolation transistor being shut off whenever said output enable control signal has a first state, and output voltage level sustaining means responsive to an output on one of said signal paths from one of said input translators and further responsive to at least one output enable control signal for maintaining said voltage level at said output node that has been established by said first and second output transistors, said output voltage level sustaining means being disable in response to said output enable control signal.

* * * * *